United States Patent
Balamurugan et al.

(10) Patent No.: US 8,375,242 B2
(45) Date of Patent: *Feb. 12, 2013

(54) CLOCK AND DATA RECOVERY (CDR) METHOD AND APPARATUS

(75) Inventors: Ganesh Balamurugan, Hillsboro, OR (US); Frank P. O'Mahony, Portland, OR (US); Bryan K. Casper, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/196,871

(22) Filed: Aug. 2, 2011

(65) Prior Publication Data

US 2011/0289341 A1   Nov. 24, 2011

Related U.S. Application Data

(63) Continuation of application No. 12/165,428, filed on Jun. 30, 2008, now Pat. No. 8,015,429.

(51) Int. Cl.
*G06F 1/12* (2006.01)
*G06F 1/04* (2006.01)
*H04L 27/00* (2006.01)

(52) U.S. Cl. ............... 713/600; 713/375; 375/316

(58) Field of Classification Search .................. 713/600
See application file for complete search history.

(56) References Cited

U.S. PATENT DOCUMENTS

| | | | |
|---|---|---|---|
| 5,056,118 A | 10/1991 | Sun | |
| 6,307,906 B1 | 10/2001 | Tanji et al. | |
| 7,076,377 B2 * | 7/2006 | Kim et al. | 702/66 |
| 7,089,444 B1 | 8/2006 | Asaduzzaman et al. | |
| 7,123,678 B2 | 10/2006 | Hendrickson | |
| 7,209,525 B2 | 4/2007 | Laturell et al. | |
| 7,315,598 B2 | 1/2008 | Lee et al. | |
| 7,366,267 B1 | 4/2008 | Lee et al. | |
| 7,489,757 B2 | 2/2009 | Totsuka et al. | |
| 7,519,138 B2 | 4/2009 | Lee et al. | |
| 7,532,695 B2 | 5/2009 | Sanders et al. | |
| 7,568,137 B1 | 7/2009 | Kellermann | |
| 7,668,271 B2 | 2/2010 | Kim et al. | |
| 7,765,074 B2 * | 7/2010 | Kim et al. | 702/66 |
| 7,809,054 B2 * | 10/2010 | Carballo et al. | 375/232 |
| 7,812,749 B2 | 10/2010 | Abel et al. | |
| 7,817,767 B2 * | 10/2010 | Tell et al. | 375/376 |
| 7,916,822 B2 | 3/2011 | Aziz et al. | |

OTHER PUBLICATIONS

Palmer et al., "A 14mW 6.25Gb/s Transceiver in 90nm CMOS for Serial Chip-to-Chip Communications," 2007 IEEE International Solid-State Circuits Conference, ISSCC 2007, Digest of Technical Papers, IEEE International, Feb. 11-15, 2007.

(Continued)

*Primary Examiner* — Suresh Suryawanshi
(74) *Attorney, Agent, or Firm* — Schwabe, Williamson & Wyatt, P.C.

(57) ABSTRACT

Embodiments of methods and apparatus for clock and data recovery are disclosed. In some embodiments, a method for recovering data from an input data stream of a device is disclosed, the method comprising synchronizing, during an initialization phase, a data clock (DCK) with an input data stream; synchronizing, during the initialization phase, an edge clock signal (ECK) with the input data stream based at least in part on a phase relationship between the ECK and the synchronized DCK; and sampling, during the initialization phase, a rising edge of the input data stream with the synchronized ECK to generate a transition level reference voltage. Additional variants and embodiments may also be disclosed and claimed.

20 Claims, 5 Drawing Sheets

OTHER PUBLICATIONS

Casper et al., "A 20Gb/s Forwarded Clock Transceiver in 90nnn CMOS," 2006 IEEE International Solid-State Circuits Conference, 2006 IEEE International Conference Digest of Technical Papers, Feb. 6-9, 2006.

Harwood et al., "A 12.5Gb/s SerDes in 65nm CMOS Using a Baud-Rate ADC with Digital Receiver Equalization and Clock Recovery," 2007 IEEE International Solid-State Circuits Conference, ISSCC 2007, Digest of Technical Papers, IEEE International, Feb. 11-15, 2007.

Yang et al. A 0.5-µm CMOS 4.0-Gbit/s Serial Link Transceiver with Data Recovery Using Oversampling, IEEE, vol. 33, No. 5, May 1998.

* cited by examiner

CLOCK AND DATA RECOVERY (CDR) METHOD AND APPARATUS

CROSS-REFERENCE TO RELATED APPLICATION

This application is a continuation application of, and claims priority under 35 U.S.C. §120 to, U.S. patent application Ser. No. 12/165,428, filed Jun. 30, 2008, assigned to the same assignee as the present application, and incorporated herein by reference in its entirety.

TECHNICAL FIELD

Embodiments of the disclosure relate generally to fields of integrated circuits and electronic systems, and more particularly, to clock and data recovery methods and apparatuses.

BACKGROUND

Instead of separately transmitting a clock and a data stream, high speed electronic digital data communication systems often transmit only the data stream to achieve a better bandwidth. A clock and data recover (CDR) circuit within a receiver may recover a clock signal from the incoming data stream. The clock may be recovered using edges within the incoming data stream. Once the clock is recovered, it may be used to sample the data stream to recover the individual bits in the data stream. To meet stringent bit error rate (BER) requirement (e.g., less that $10^{-15}$), the incoming data stream at the receiver should be optimally sampled, requiring reliable and accurate clock recovery by the CDR circuit.

BRIEF DESCRIPTION OF THE DRAWINGS

Various embodiments will be described referencing the accompanying drawings in which like references denote similar elements, and in which.

DETAILED DESCRIPTION OF ILLUSTRATIVE EMBODIMENTS

Illustrative embodiments include, but are not limited to, methods and apparatus for clock and data recovery.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Figure 1:
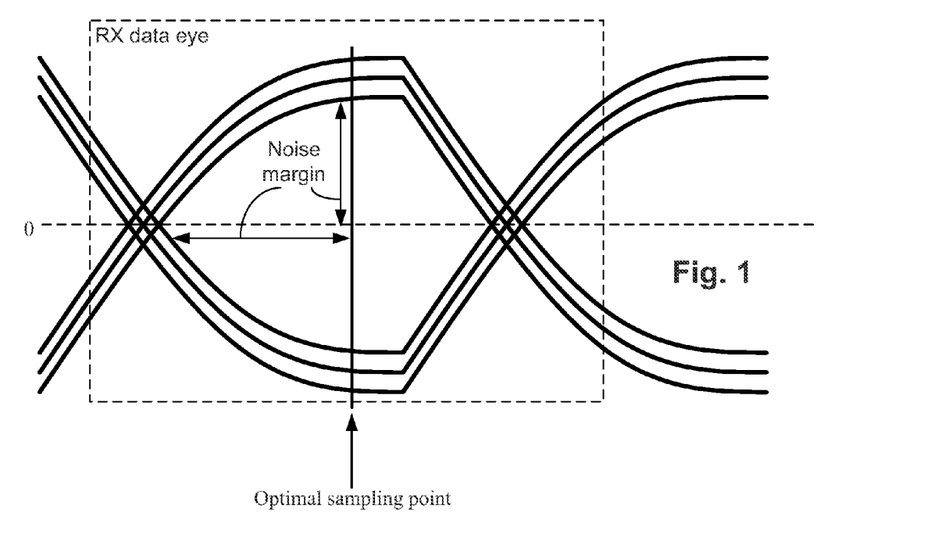
FIG. 1 illustrates a data eye of an exemplary incoming data stream received at a receiver.

Although specific embodiments have been illustrated and described herein, it will be appreciated by those of ordinary skill in the art that a wide variety of alternate and/or equivalent implementations may be substituted for the specific embodiments shown and described, without departing from the scope of the embodiments of the disclosure. This application is intended to cover any adaptations or variations of the embodiments discussed herein. Therefore, it is manifestly intended that the embodiments of the disclosure be limited only by the claims and the equivalents thereof FIG. 1 illustrates a data eye of an exemplary incoming data stream received at a receiver. A data eye is an oscilloscope display in which a data signal from a receiver is repetitively sampled and applied to a vertical input, while the data rate is used to trigger a horizontal sweep. Note that the data eye in FIG. 1 is purely exemplary in nature; data eyes of other shapes are also possible based on the data stream.

FIG. 1 also illustrates a substantially optimal sampling point of the data stream. This may be the point where the incoming data stream may be sampled to substantially maximize noise margins of the sampling. In various embodiments, the sampling may be performed by aligning a sampling clock phase with the optimal sampling point.

Figure 2:
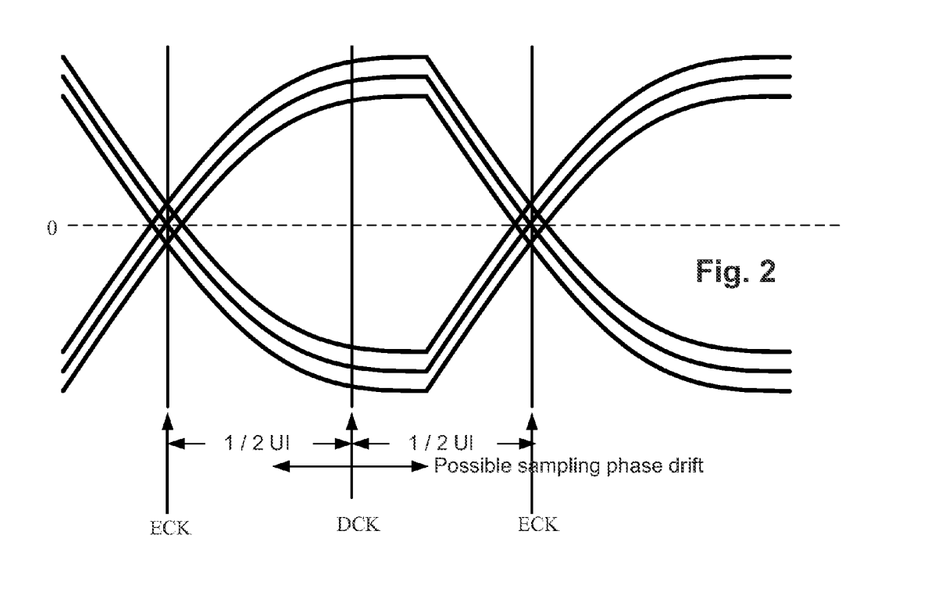
FIG. 2 illustrates sampling an exemplary incoming data stream using a data clock and an edge clock utilizing a conventional edge based CDR circuit.

FIG. 2 illustrates sampling an incoming data stream using a data clock (DCK) and an edge clock (ECK) utilizing a conventional edge based CDR circuit (not illustrated), in which the DCK phase is aligned with the optimal sampling point of FIG. 1. Such sampling of the incoming data stream using the DCK may substantially maximize noise margins.

However, under this approach, determining the optimal sampling point may not always be possible during normal operation of the receiver. Additionally, the data stream may exhibit drift, due to which the DCK clock phase may also drift (either leftwards or rightwards) with respect to the data stream, illustrated by the horizontal arrow in FIG. 2. The drift in the data stream (i.e., gradual, sudden or occasional change of the phase relationship between the data stream and the ECK/DCK) may be based in part on various parameters, e.g., random parameters like voltage fluctuation, temperature fluctuation, etc. In order to maintain the optimal sampling phase relationship between the DCK and the data stream, it may be necessary to track the data stream drift and re-align or re-synchronize the DCK with the data stream accordingly.

To achieve such re-alignment or re-synchronization of the DCK, a conventional edge based CDR circuit (not illustrated) may be utilized, which may use the two clocks (DCK and ECK) to sample the incoming data stream, as is well known in the art. The ECK may be used to sample the data stream at an edge (i.e., transition or zero crossing) of the data stream. However, in response to a drift in the data stream, the ECK may also shift with respect to the data. That is, realignment or re-synchronization of the ECK may be periodically or continuously required to ensure that ECK samples the data only at the edge. As a result of such realignment, ECK may continue to sample the data at the edge even in the event of data drift.

Once ECK is re-aligned or re-synchronized with the data edge, DCK may be synchronized such that DCK is in quadrature relationship with the ECK (i.e., ½ unit interval (UI) from the ECK), as illustrated in FIG. 2. Such synchronization of the DCK may ensure that DCK samples the data stream at the horizontal midpoint of the data eye (i.e., ½ UI from ECK), which may ensure large noise margins. For a substantially symmetrical (both left-right (i.e. horizontal) symmetrical and vertical symmetrical) data eye, placing the DCK at ½ UI from the edge may ensure substantially maximized noise margin, as is well known in the art. Continuous or periodic re-alignment of the ECK with the data edge may result in the ECK sampling the data stream at the edge or zero transition, even if the data stream drifts because of external factors. As DCK is also re-synchronized with respect to the ECK (to maintain quadrature phase relationship between the ECK and the DCK), the DCK may continue sampling the data stream at ½ UI away from the zero crossing or edge of the data stream, even if the data stream drifts.

A number of techniques to align the ECK with data edges are known in the art. In one such exemplary technique, data sampled with the ECK only during the rising edges may be considered. If, during a rising edge, the value of the data sampled with the ECK is greater than zero volt, a '1' may be assigned to it. Similarly, if, during a rising edge, the value of the data sampled with the ECK is less than zero volt, a '0' may be assigned to it. Ideally, if ECK is substantially aligned with the data edge, the average number of the 1s and 0s would be substantially equal. However, for example, the number of 1s greater than the number of 0s may imply that the ECK has shifted rightwards (in FIG. 2) such that it is sampling the rising edges of the data after the zero crossing. In such scenario, the ECK may be shifted leftwards until the average number of 1s and 0s are again substantially equal. Similarly, in case the number of 0s is greater than 1s, the ECK may be needed to be shifted rightwards. In another similar technique, the falling edge of the ECK is employed.

The above discussed conventional edge based CDR system may successfully realign the ECK with the data edge, and accordingly, realign the DCK even in the event of a drift in the data stream. However, conventional edge based CDR system may suffer from several drawbacks. For example, although the conventional edge based CDR system relies on a precise quadrature relationship between the ECK and the DCK (i.e., ½ UI phase difference between the ECK and the DCK) to ensure optimal sampling of the data stream by the DCK, in practice, such precise quadrature relationship between the ECK and the DCK may be difficult to achieve (due to semiconductor process variations or other random errors, for example), resulting in compromising the noise margins for data samples.

Additionally, as previously discussed, if the data eye is symmetrical (both left-right and vertical), the optimal sampling point may lie ½ UI from the edge. However, because of several factors, the eye of a data stream received at a receiver may not always be symmetrical (note that the data eyes illustrated in the figures are not vertically symmetrical). The reasons for asymmetry in the received data eye may include, but is not limited to, channel dispersion leading to inter-symbol interference (ISI), symbol-rate transmit and/or receive equalization, etc, as is well known in the art. As a result, the optimal sampling point (that substantially maximizes the noise margins) may not lie exactly ½ UI from the edge. That is, even a precise quadrature relationship between the ECK and the DCK (although such precise relationship is hard to establish in practice) may not ensure optimal sampling of the data stream by the DCK.

Figure 3:
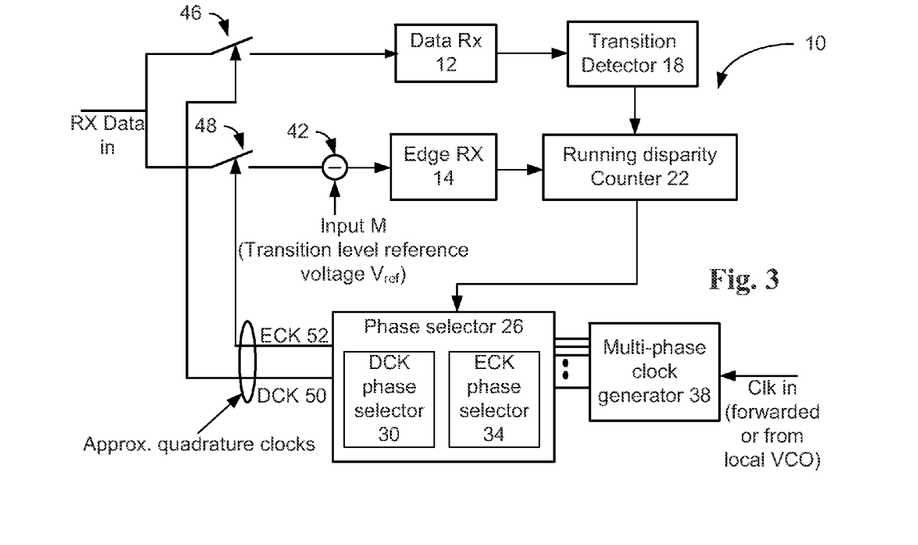
FIG. 3 illustrates an exemplary block diagram of a CDR circuit, in accordance with various embodiments.

FIG. 3 illustrates an exemplary block diagram of a CDR circuit 10, in accordance with various embodiments of the disclosure. In various embodiments, the CDR circuit 10 may receive incoming data streams (RX Data in). The incoming data streams may be received from various sources (local or remote) over any one of a number of medium, e.g., over a direct coupling, a bus, or a communication channel. In various embodiments, two sampling circuits, 46 and 48 may sample the incoming data stream to generate corresponding sampled data streams, received in a data receiver 12 and an edge receiver 14, respectively. The sampling circuits 46 and 48 may be configured to be controlled by a phase selector 26. The phase selector 26 may receive multi phase clock signals from a multi phase clock generator 38, and may generate a data clock (DCK) 50 and an edge clock (ECK) 52.

In various embodiments, the phase selector 26 may include a data clock (DCK) phase selector 30 and an edge clock (ECK) phase selector 34. The DCK phase selector 30 may generate the DCK 50, while the ECK phase selector 34 may generate the ECK 52. In various embodiments, the DCK 50 and the ECK 52 may control the sampling circuits 46 and 48, respectively. For example, the sampling circuit 46 may sample the incoming data stream at leading edges of the DCK 50. Operation of the phase selector circuit 26 will be discussed in more detail later. In various embodiments, the CDR circuit 10 may also include a transition detector 18 and a running disparity counter 22, which will also be discussed in more detail later. In various embodiments, phase selector 26 may include a controller (not illustrated) coupled to the DCK and ECK phase selectors 30 and 34 to control their operations. In other embodiments, the CDR circuit 10 may include a controller (not illustrated) coupled to various components of the CDR circuit 10 (including e.g. phase selector 26), wherein the controller may include logic configured to control operations of the one or more components of the CDR circuit 10 as described.

Figure 4:
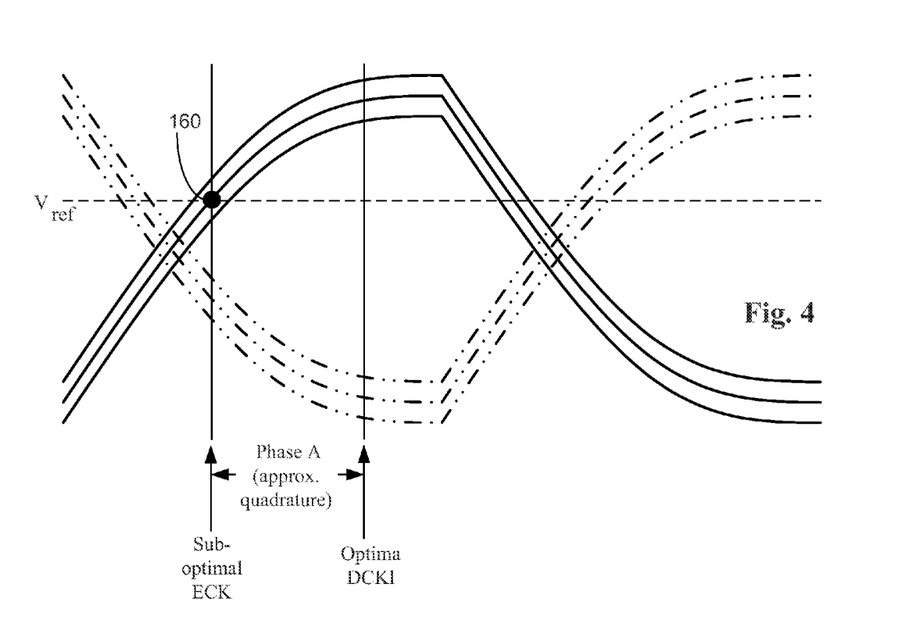
FIG. 4 illustrates sampling an exemplary incoming data stream using DCK and ECK, during an initialization phase, in accordance with various embodiments.
Figure 7:
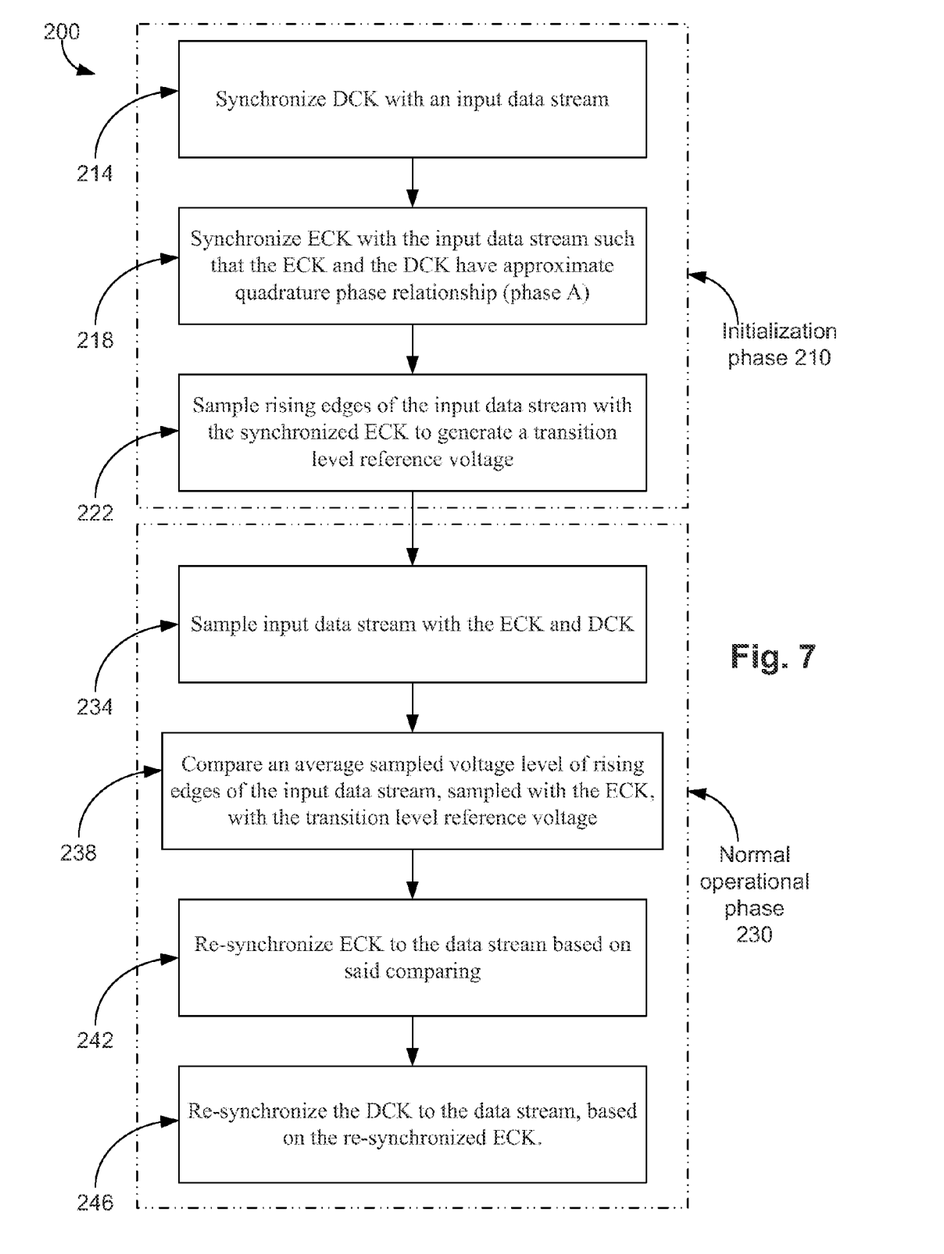
FIG. 7 illustrates an exemplary method of recovering clock and data signals from an input data stream, in accordance with various embodiments.

The CDR circuit 10 may operate in two phases: an initialization phase and a normal operational phase. FIG. 4 illustrates sampling an incoming data stream using the DCK 50 and the ECK 52, during an initialization phase, in accordance with various embodiments. In various embodiments, during the initialization phase, the CDR circuit 10 of FIG. 3 may receive pseudo random data stream. The initialization phase may take place during a link initialization of the CDR circuit 10. In various embodiments, the initialization phase may take place when the CDR circuit 10 is switched 'ON' and/or when the CDR circuit 10 wakes up from a sleep state. The initialization phase may take place during other situations as well, for example, when the CDR circuit 10 recovers from an error state. In various embodiments, the initialization phase may also take place periodically, at routine intervals. After completion of the initialization phase, the CDR circuit 10 may enter a normal operational phase. FIG. 7 illustrates an exemplary method 200 of recovering clock and data signals from an input data stream, in accordance with various embodiments. The method of FIG. 7 includes an initialization phase 210 and a normal operational phase 230.

Referring to FIGS. 3, 4 and 7, during the initialization phase 210, the phase of the DCK 50 may be substantially optimized with respect to the incoming data (i.e., the DCK 50 may be optimally synchronized, at 214, with the incoming data) such that when the incoming data is sampled using the DCK 50, noise margins of the sampled data may be substantially maximized. As previously noted, for a substantially symmetrical (both left-right (i.e. horizontal) symmetrical and vertical symmetrical) data eye, placing the DCK at ½ UI from the data edge may ensure substantially optimal synchronization of the DCK 50. However, if the data stream is not symmetrical (as is the case in FIG. 3), optimal placement of the DCK 50 may not be at ½ UI from the data edge. If so, DCK 50 may be synchronized with the incoming data stream during the initialization phase using any one of a number of techniques.

Once the DCK 50 is optimally synchronized with the incoming data stream, still during the initialization phase, the ECK 52 may be synchronized with the incoming data stream at 218 such that the phase difference between the ECK 52 and the DCK 50 is approximately ½ UI or approximately quadrature (illustrated as phase A in FIG. 4). In various embodiments, the phase difference between the ECK 52 and the DCK 50 may be within ±20% of ½ UI. In various embodiments henceforth, this position of the ECK with respect to the data stream may be referred as sub-optimal position (note that unlike DCK, ECK has not optimal position for sampling).

In various embodiments, once DCK 50 and ECK 52 are synchronized with the incoming data stream, the ECK 52 may be used to sample only the rising edges of the data stream. Alternatively, in various embodiments, both the rising edges and the falling edges of the data stream may be sampled with the ECK 52, although only the sampled values of the rising edges of the data stream may be considered. In various embodiments, the transition detector 18 may detect the rising edges of the incoming data stream and transmit the detection information to the running disparity counter 22. The input M to the subtractor 42 may be zero during the initialization stage. The edge receiver 14 may receive the sampled incoming data stream, sampled with ECK 52. In various embodiments, the running disparity counter 22 may consider only those sampled incoming data stream that were sampled during rising edges of the incoming data stream. In various embodiments, the subtractor 42 and/or the running disparity counter 22 may be a part of the edge receiver 14.

In various embodiments, at 222, the average sampled voltage (illustrated by circle 160 in FIG. 4) of a plurality of rising edges of the data stream, as sampled with the ECK 52, may be measured to generate a transition level reference voltage $V_{ref}$. That is, the transition level reference voltage $V_{ref}$ may be the average of the sampled voltages of the plurality of rising edges of the data stream, as sampled with the ECK 52 during the initialization phase. Note that $V_{ref}$ need not be zero, and may depend in part on the optimal synchronization of the DCK 50 and the phase relationship between the DCK 50 and the ECK 52.

In various embodiments, after completion of the initialization phase, the CDR circuit 10 of FIG. 3 may enter in the normal operational phase 230 (FIG. 7). In the normal operational phase, the CDR circuit 10 may be used to sample incoming data stream to recover the individual bits in the data stream. In case there is no data drift, the DCK 50, which was synchronized to substantially optimally sample incoming data stream during the initialization phase, may continue to substantially optimally sample incoming data stream during the normal operational phase as well.

However, as previously discussed, there may be instances of a drift or shift in the incoming data stream. As a result, the DCK 50 may no longer be substantially optimally sampling the incoming data stream during the normal operation phase. Accordingly, in various embodiments, the DCK may be needed to be re-synchronized such that it continues to optimally sample the incoming data stream during the normal operation phase, even in the event of possible data drift.

In various embodiments, during the normal operational phase 230, at 234, an input data stream may be sampled with ECK 52 and DCK 50 such that the phase relationship between the ECK 52 and DCK 50 is still maintained at phase A (which may be approximately quadrature), as set during the initialization phase. However, due to possible drift in the data stream, the DCK may no longer sample the data stream substantially optimally. As a result, the ECK may no longer sample the rising edges of the data stream at the transition level reference voltage $V_{ref}$.

Figure 5:
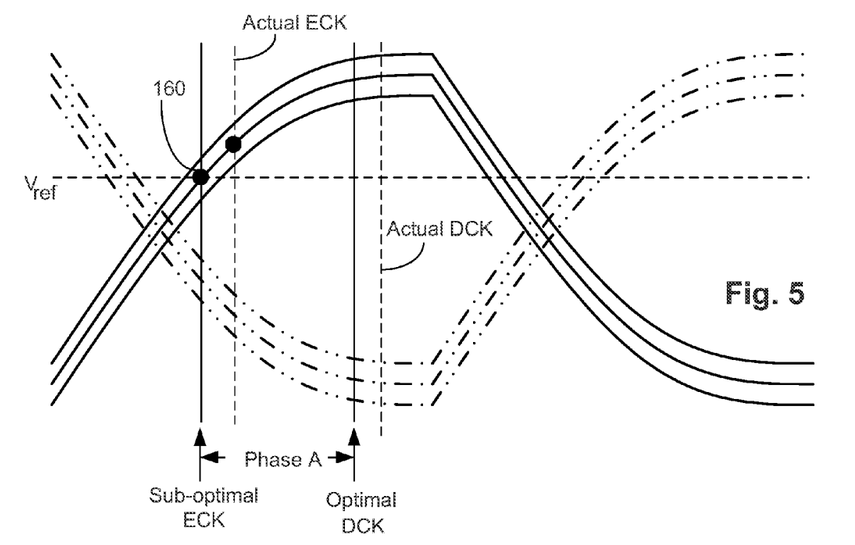
FIGS. 5 and 6 illustrate sampling incoming data streams using DCK and ECK, during a normal operational phase, in accordance with various embodiments.
Figure 6:
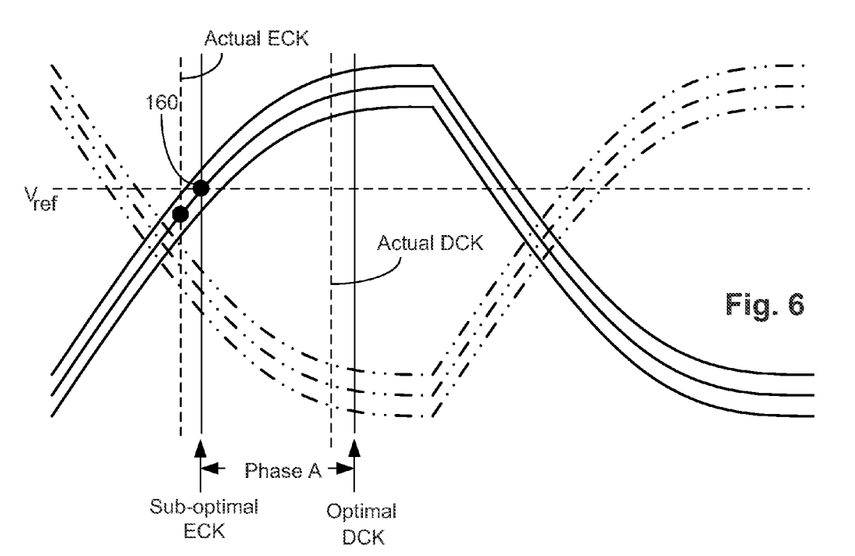

FIGS. 5 and 6 illustrate sampling incoming data streams using the DCK 50 and the ECK 52, during a normal operational phase, in accordance with various embodiments. In FIGS. 5 and 6, due to a drift in the data stream, the DCK 50 may no longer optimally sample the respective data streams.

For example, in FIG. 5, the actual DCK (i.e., the current DCK in the normal operational phase, after possible data drift) is illustrated as being sampling the data ahead (i.e., towards right in FIG. 5) of where the optimal DCK (as determined in the initialization phase) should have sampled the data stream. Accordingly, the actual ECK 52 (i.e., the current ECK in the normal operational phase, after possible data drift) is illustrated as being sampling the rising edges of the data such that the average sampled voltage level of the rising edges, as sampled with the ECK 52, is greater than $V_{ref}$.

Similarly, in FIG. 6, the actual DCK is illustrated as being sampling the data behind (i.e., towards left in FIG. 6) of where the optimal DCK should have sampled the data stream. Accordingly, the actual ECK 52 is illustrated as being sampling the rising edges of the data such that the average sampled voltage level of the rising edges, as sampled with the ECK 52, is less than $V_{ref}$.

That is, in FIGS. 5 and 6, due to data drifts, the DCK may no longer be substantially optimally sampling the data stream. Hence, the clocks (ECK and DCK) in FIGS. 5 and 6 may need to be re-synchronized to ensure that DCK 50 continues to substantially optimally sample the data stream. In various embodiments, this may be achieved by first re-synchronizing the ECK 52 such that an average sampled voltage level of a plurality of rising edges of the input data stream, sampled with the ECK 52, is substantially equal to the transition level reference voltage $V_{ref}$. This may be achieved by, for example, shifting the actual ECK 52 towards left (in FIG. 5) until it substantially overlaps the sub-optimal ECK (determined during the initialization phase). Once the ECK is re-synchronized, the DCK may also be re-synchronized accordingly, such that the phase relationship (phase A) between the ECK and DCK is maintained (i.e., the DCK may also be shifted towards left).

Referring again to FIGS. 3 and 7, as previously discussed, during the normal operational phase 230, at 234, the input data stream may be sampled with ECK 52 and DCK 50. In various embodiments, the transition detector 18 may detect the rising edges of the incoming data stream and transmit the detection information to the running disparity counter 22. The subtractor 42 may subtract $V_{ref}$ from the voltage sampled with ECK 52 in the sampling circuit 48. A positive output of the subtractor 42 would imply that the voltage sampled with the ECK is greater than $V_{ref}$ and vice versa. The output of the subtractor 42 may be received by the edge receiver 14. The edge receiver 14 may output '1' to the running disparity counter 22 if the subtractor 14 output is positive, and output '0' if the subtractor 14 output is negative. The running disparity counter 22 may also receive information from the transition detector 18 on whether a sampled voltage, sampled with ECK 52, corresponds to a rising edge or a falling edge of the data stream. In various embodiments, the running disparity counter 22 may ignore the outputs from the edge phase receiver 14 that correspond to the falling edges of the data stream, and keep track of the outputs corresponding to the rising edges only.

As would be readily understood, whenever a sampled voltage of a rising edge of the data stream is greater than $V_{ref}$, the running disparity counter 22 may receive a '1' from the edge receiver 14. On the other hand, for a sampled voltage of a rising edge less than $V_{ref}$, the running disparity counter 22 may receive a '0'. The running disparity counter 22 may keep track of the number of 1s and 0s received over a given period of time, and compare the number of 1s and 0s, which may be an indication of an average sampled voltage level of a plurality of rising edges of the input data stream, sampled with the ECK 52, with respect to $V_{ref}$. Specifically, more 1s than 0s may be an indication that the average sampled voltage level of the plurality of rising edges of the input data stream, sampled with the ECK 52, is greater than $V_{ref}$ (as is the case in FIG. 5). On the other hand, more 0s than 1s may be an indication that the average sampled voltage level is less than $V_{ref}$ (as is the case in FIG. 6). Thus, the CDR circuit 10 may compare, at 238 (FIG. 7), the average sampled voltage level of the plurality of rising edges of the input data stream, sampled with the ECK, with $V_{ref}$.

Referring to FIGS. 3 and 7, at 242, based at least in part on the comparison at 238, the ECK 52 may be re-synchronized to the data stream. For example, the average sampled voltage level of FIG. 5 is greater than $V_{ref}$ (i.e., the edge receiver 14 outputs more 1s than 0s over a given period of time) and accordingly, the ECK 52 may be gradually shifted to the left (i.e., the ECK phase may be delayed) until the average sampled voltage level is substantially equal to $V_{ref}$. This may happen when the number of 1s and 0s counted in the running disparity counter 22 is substantially equal over a given period of time.

While the ECK 52 may be re-synchronized at 242, DCK 50 may also be re-synchronized at 246 such that the phase relationship between the ECK and the DCK (phase A, as set during the initialization phase) remains the same. Although FIG. 7 illustrates the re-synchronization of the DCK after re-synchronization of the ECK, in various embodiments, the re-synchronization of the ECK and the DCK may be performed substantially simultaneously. That is, the phase of the ECK and the DCK may be advanced or lagged by same phase angle simultaneously, based on the comparison at 238. The re-synchronization of the DCK and the ECK may be carried out by the DCK phase selector 30 and the ECK phase selector 34, respectively, in response to the output received from the running disparity counter 22.

Thus, by re-synchronizing the ECK 52 to maintain the average sampled value of the rising edge, sampled with ECK, at $V_{ref}$, it may be possible for the ECK to track possible phase drifts in the data stream. Additionally, as DCK 50 is maintained at a substantially constant phase angle with the ECK (phase angle A), the DCK 50 may also track any drift in the data stream, and adjust accordingly, such that DCK 50 continues to sample the data stream optimally in spite of data stream drift.

The CDR circuit of FIG. 3 and the method of FIG. 7 have several advantages over the previously discussed conventional edge based CDR circuit (see FIG. 2). For example, unlike conventional edge based CDR circuit that requires a perfect quadrature relationship between the ECK and the DCK (which may be hard to establish in practice), in various embodiments, the CDR circuit of FIG. 3 do not require precise quadrature relationship between the ECK and the DCK (rather, an approximate quadrature relationship is required, which may be easily established). Additionally, unlike the conventional edge based CDR circuit, the CDR circuit of FIG. 3 need not place the DCK at exactly ½ UI away from the zero crossing. Rather, the optimal sampling point by the DCK may be determined to substantially maximize performance margins during the initialization phase. This is particularly helpful when the data stream is not symmetrical (in which case, the optimal sampling point not coinciding with the ½ UI point).

There are several other advantages of the CDR circuit of FIG. 3. For example, once the initialization phase is over, the circuit of FIG. 3 does not require re-training; it can re-synchronize the clocks (ECK and DCK) during the normal operational phase, thereby not interrupting the normal operation of the CDR circuit 10.

Although various embodiments have been described with respect to the ECK sampling only the rising edges of the data stream, as would be readily apparent to those skilled in the art, the CDR circuit 10 may also be configured to take into account samplings of only the falling edges (instead of the rising edges) of the data stream, sampled with the ECK. This may require certain changes in the system, which would be readily appreciated by those skilled in the art. For example, in that case, $V_{ref}$ may be negative, and re-synchronizing the ECK and the DCK at 242 and 246 of FIG. 7 may have to be changed accordingly.

Although in some of the embodiments discussed earlier, the DCK and the ECK have been disclosed to be in approximately quadrature relationship, this may not be necessarily the case. For example, in various embodiments, the phase angle between the DCK and the ECK may be set to approximately 45 degrees (or other appropriate phase angles) during the initialization phase. Additionally, although in some of the embodiments discussed earlier, a 2× interleaved data sampled have been disclosed, a 4× interleaved data sampler may also be used in various embodiments. While using a 4× interleaved data sampler, a phase separation of approximately 45 degrees may be set during the initialization phase between the DCK and the ECK. Note that for a 4× interleaved sampler, 45 degree phase separation may correspond to a ½ UI separation between the DCK and the ECK.

Figure 8:
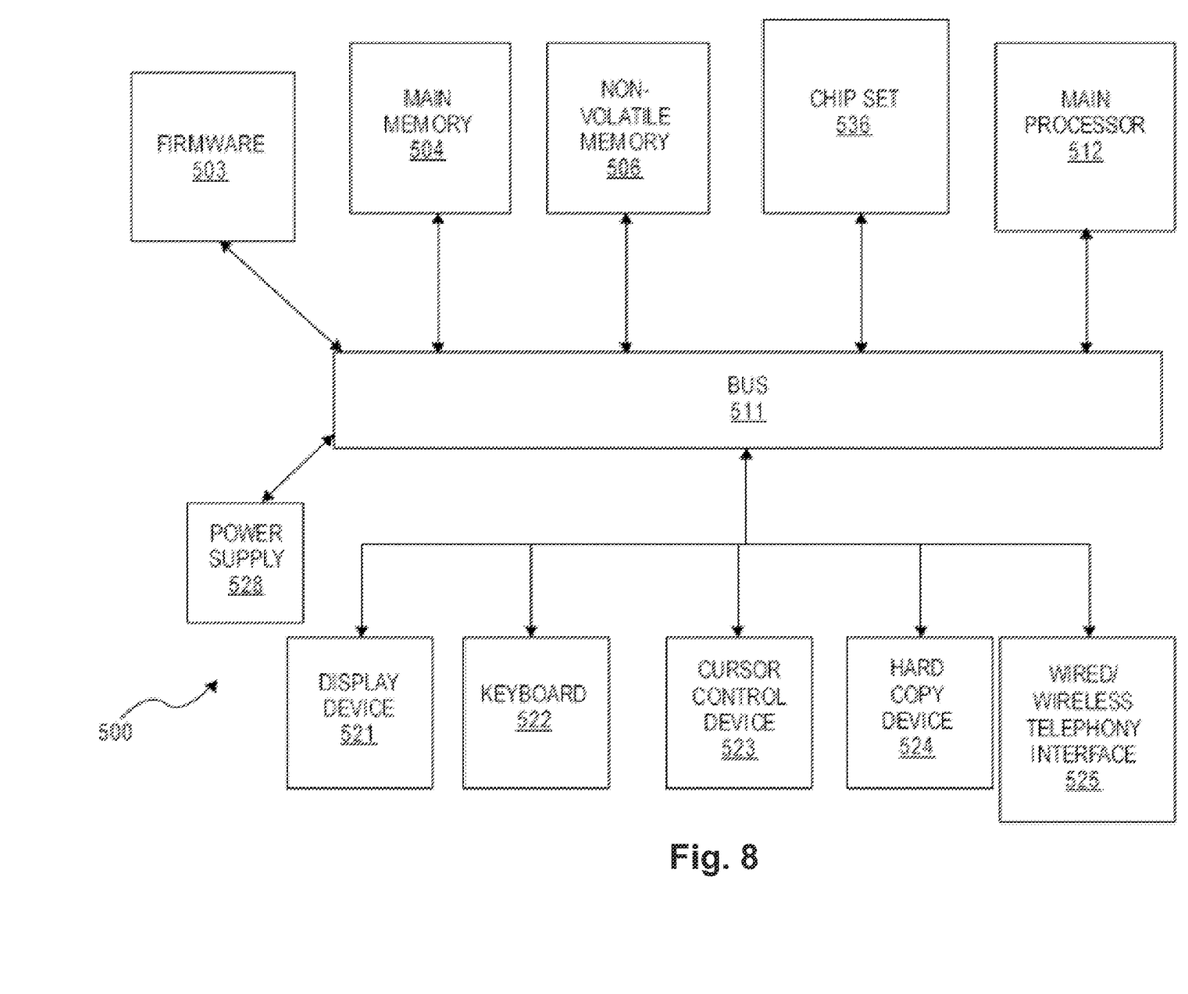
FIG. 8 illustrates a block diagram of an example computing system that may be suitable for practicing some of the embodiments, including the systems of recovering clock and data from an incoming data stream.

FIG. 8 illustrates a block diagram of an example computing system 500 that may be suitable for practicing some of the embodiments, including the systems of recovering clock and data from an incoming data stream. In some embodiments, the computing system 500 may include a communication mechanism or bus 511 for communicating information, and an integrated circuit component such as a processor 512 coupled with bus 511 for processing information.

Computing system 500 further comprises a random access memory (RAM) or other dynamic storage device 504 (referred to as main memory) coupled to bus 511 for storing information and instructions to be executed by processor 512. Main memory 504 also may be used for storing temporary variables or other intermediate information during execution of instructions by processor 512.

Firmware 503 may be a combination of software and hardware, such as Electronically Programmable Read-Only Memory (EPROM) that has the operations for the routine recorded on the EPROM. The firmware 503 may embed foundation code, basic input/output system code (BIOS), or other similar code. The firmware 503 may make it possible for the computing system 500 to boot itself.

Computing system 500 also comprises a read-only memory (ROM) and/or other static storage device 506 coupled to bus 511 for storing static information and instructions for processor 512. The static storage device 506 may store OS level and application level software.

Computing system 500 may further be coupled to a display device 521, such as a cathode ray tube (CRT) or liquid crystal display (LCD), coupled to bus 511 for displaying information to a computer user. A chipset, such as chipset 536, may interface with the display device 521.

An alphanumeric input device (keyboard) 522, including alphanumeric and other keys, may also be coupled to bus 511 for communicating information and command selections to processor 512. An additional user input device is cursor control device 523, such as a mouse, trackball, trackpad, stylus, or cursor direction keys, coupled to bus 511 for communicating direction information and command selections to processor 512, and for controlling cursor movement on a display device 521. A chipset, such as chip set 536, may interface with the input output devices.

Another device that may be coupled to bus 511 is a hard copy device 524, which may be used for printing instructions, data, or other information on a medium such as paper, film, or similar types of media. Furthermore, a sound recording and playback device, such as a speaker and/or microphone (not shown) may optionally be coupled to bus 511 for audio interfacing with computing system 500. Another device that may be coupled to bus 511 is a wired/wireless communication capability 525.

Computing system 500 has a power supply 528 such as a battery, AC power plug connection and rectifier, etc., as one of ordinary skill in the relevant art would appreciate based at least on the teachings provided herein.

In various embodiments, a CDR circuit (not illustrated), similar to the CDR circuit 10 of FIG. 3, may be integrated in component 525 or any one of the bus agents coupled to the bus 511. The CDR circuit may receive incoming data stream from a network communication channel or bus 511. Alternatively, in various embodiments, the CDR circuit may be integrated in a component that receives incoming data stream from a receive antenna coupled to the computing system 500. In various embodiments, the CDR circuit may be integrated in a component that directly receives incoming data stream from other components of the computing system 500. The CDR circuit, in each case, may recover clock signals and data from the incoming data stream, as previously discussed. In various embodiments, an integrated controller as earlier described may be configured to control one or more operations of the CDR circuit.

Although certain example methods, apparatus, and articles of manufacture have been described herein, the scope of coverage of this disclosure is not limited thereto. On the contrary, this disclosure covers all methods, apparatus, and articles of manufacture fairly falling within the scope of the appended claims either literally or under the doctrine of equivalents. For example, although the above discloses example systems including, among other components, software or firmware executed on hardware, it should be noted that such systems are merely illustrative and should not be considered as limiting. In particular, it is contemplated that any or all of the disclosed hardware, software, and/or firmware components could be embodied exclusively in hardware, exclusively in software, exclusively in firmware or in some combination of hardware, software, and/or firmware.

What is claimed is:

1. A method to recover data from an input data stream of a device, the method comprising:
   synchronizing, during an initialization phase of the device, a data clock (DCK) with the input data stream; and
   synchronizing, during the initialization phase, an edge clock (ECK) with the input data stream based at least in part on a phase relationship between the ECK and the synchronized DCK.

2. The method of claim 1, further comprising:
   sampling, during the initialization phase, an edge of the input data stream with the synchronized ECK, including generating a reference voltage to maintain synchronization during a subsequent operational phase.

3. The method of claim 2, further comprising:
   sampling, during the subsequent operational phase of the device, another input data stream with the ECK and DCK having said phase relationship; and
   comparing, during the subsequent operational phase, an average sampled voltage level of a plurality of rising edges of the another input data stream, sampled with the ECK, with said reference voltage.

4. The method of claim 3, further comprising:
   selectively re-synchronizing, during the subsequent operational phase, the ECK to the another data stream based at least in part on said comparing; and
   selectively re-synchronizing, during the subsequent operational phase, the DCK to the another data stream, based at least in part on the re-synchronized ECK.

5. The method of claim 4, wherein said selectively re-synchronizing the DCK includes:
   selectively re-synchronizing the DCK such that said phase relationship between the re-synchronized DCK and the re-synchronized ECK is maintained.

6. The method of claim 4, wherein said selectively re-synchronizing the ECK includes:
   selectively re-synchronizing the ECK to substantially equalize the average sampled voltage level of the plurality of rising edges of the another input data stream, sampled with the ECK, with the reference voltage.

7. The method of claim 1, wherein said synchronizing the DCK during the initialization phase includes:
   synchronizing the DCK such that the input data stream is substantially optimally sampled with the DCK, and a noise margin to sample the data stream is substantially maximized.

8. The method of claim 1, wherein said synchronizing the ECK during the initialization phase includes:
   synchronizing the ECK such that the ECK is in said phase relationship with the DCK, wherein said phase relationship is approximately equal to a quadrature phase relationship.

9. An apparatus to recover a clock and data from an input data stream, the apparatus comprising:
   a data clock phase selector configured to synchronize a data clock (DCK) with the input data stream;
   an edge clock phase selector configured to synchronize an edge clock (ECK) with the input data stream; and
   a controller coupled to the data clock phase selector and the edge clock phase selector, the controller including logic configured to control the data clock phase selector and the edge clock phase selector to synchronize the DCK and the ECK with the input data stream respectively, during an initialization phase, such that the ECK is in a target phase relationship with the DCK.

10. The apparatus of claim 9, further comprising:
a sampling circuit coupled to the edge clock phase selector and configured to sample an edge of the input data stream with the ECK to generate a reference voltage.

11. The apparatus of claim 10, wherein the controller is configured to control the sampling circuit to sample, during an operational phase subsequent to the initialization phase, a second input data stream with the ECK and DCK such that the ECK is in the target phase relationship with the DCK.

12. The apparatus of claim 10, wherein the controller is configured to control the edge clock phase selector to re-synchronize, during an operational phase, the ECK with a second input data stream such that an average sampled voltage level of a plurality of rising edges of the second input data stream, sampled with the ECK, is substantially equal to said reference voltage.

13. The apparatus of claim 10, further comprising:
a running disparity counter configured to compare, during an operational phase, an average level of sampled voltage of a plurality of rising edges of a second input data stream with said reference voltage.

14. The apparatus of claim 13,
wherein the controller is configured to control the edge clock phase selector to selectively re-synchronize the ECK, during the operational phase, in response to the comparison; and
wherein the controller is further configured to control the data phase selector to selectively re-synchronize the DCK, during the operational phase, based at least in part on selectively re-synchronization of the ECK by the edge phase selector.

15. The apparatus of claim 9, wherein the controller is configured to control the data clock phase selector and edge clock phase selector such that during an operational phase, the ECK is in the target phase relationship with the DCK.

16. The apparatus of claim 9, wherein the controller is configured to control the data clock phase selector to synchronize, during the initialization phase, the DCK with the input data stream such that the DCK substantially optimally samples the input data stream.

17. A system, comprising:
a bus; and
a bus agent coupled to the bus, the bus agent including:
    a data clock phase selector configured to synchronize a data clock (DCK) with an input data stream received from the bus;
    an edge clock phase selector configured to synchronize an edge clock (ECK) with the input data stream; and
    a controller coupled to the data clock phase selector and the edge clock phase selector, the controller including logic configured to control the data clock phase selector and the edge clock phase selector to synchronize the DCK and the ECK with the input data stream respectively, such that the ECK is in a target phase relationship with the DCK.

18. The system of claim 17, further comprising:
a sampling circuit coupled to the edge clock phase selector and configured to sample an edge of the input data stream with the ECK to generate a reference voltage.

19. The system of claim 18, wherein the bus agent further includes:
a running disparity counter configured to compare an average level of sampled voltage of a plurality of rising edges of a second input data stream with said reference voltage.

20. The system of claim 18, wherein the controller is configured to control the edge clock phase selector to re-synchronize, during an operational phase, the ECK with a second input data stream such that an average sampled voltage level of a plurality of rising edges of the second input data stream, sampled with the ECK, is substantially equal to said reference voltage.

* * * * *